US006437581B1

(12) United States Patent
Blossfeld

(10) Patent No.: US 6,437,581 B1
(45) Date of Patent: Aug. 20, 2002

(54) TWO WIRE SENSOR DEVICE

(75) Inventor: Lothar Blossfeld, Breitnau (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/558,286

(22) Filed: Apr. 25, 2000

(30) Foreign Application Priority Data

Apr. 27, 1999 (DE) ........................................ 199 19 084

(51) Int. Cl.[7] ................................................ G01R 27/00

(52) U.S. Cl. ....................... 324/600; 324/236; 324/537; 340/664

(58) Field of Search ................................ 324/537, 555, 324/600, 679, 236, 538, 664, 682; 340/3.4, 870.4, 664; 361/179, 181; 307/116

(56) References Cited

U.S. PATENT DOCUMENTS

| | | | | |
|---|---|---|---|---|
| 4,374,333 | A | | 2/1983 | Avery |
| 4,939,455 | A | * | 7/1990 | Tsugawa |
| 5,049,878 | A | * | 9/1991 | Stern |
| 5,142,235 | A | * | 8/1992 | Matsumoto |
| 5,488,307 | A | * | 1/1996 | Plott |
| 5,535,243 | A | * | 7/1996 | Voegele |
| 5,777,550 | A | * | 7/1998 | Maltby |
| 5,790,046 | A | * | 8/1998 | Blossfeld |

FOREIGN PATENT DOCUMENTS

| | | |
|---|---|---|
| DE | 30 02 668 | 1/1980 |
| DE | 38 28 428 | 8/1988 |
| DE | 691 29 189 T2 | 10/1991 |
| EP | 0 363 001 A2 | 8/1989 |
| EP | 0 660 089 B1 | 11/1994 |
| EP | 0 883 097 A2 | 5/1998 |

* cited by examiner

*Primary Examiner*—Michael J. Sherry
*Assistant Examiner*—Trung Nguyen
(74) *Attorney, Agent, or Firm*—Samuels, Gauthier & Stevens, LLP

(57) ABSTRACT

Two-wire sensors for measuring physical quantities have only two connections (A1, A2), which serve to connect the power supply and also to conduct the measuring signals. However, because two-wire sensors have the property of controlled current sources, they can be connected only in parallel. Consequently, for a parallel circuit of n two-wire sensors disposed at different locations, two n lines are required. To reduce the number of lines, a two-wire sensor is provided with an end stage (W), which generates an output voltage (UA), which is a measure of the physical quantity measured by a measuring sensor (S) and which is always greater than an adjustable reference voltage signal (Uref). Because the inventive two-wire sensor therefore has the property of a voltage source, several of them can be connected in series. Consequently, even for a series circuit of several two-wire sensors, only two lines are required.

13 Claims, 5 Drawing Sheets

TWO WIRE SENSOR DEVICE

BACKGROUND OF THE INVENTION

The invention relates generally to the field of two wire sensor devices, and in particular to a two-wire sensor device with a measuring sensor that has two connections for transmitting the measurement signal and simultaneously providing electrical power.

Conventional two-wire sensors comprise a measuring sensor that measures a physical quantity (e.g., temperature, pressure, or magnetic field strength) and electronic components to process the signals provided by the measuring sensor. Electrical power and the measured and processed signals are conducted over only two lines, which is the basis of the name two-wire sensor. Consequently, a two-wire sensor has only two connections, which simultaneously are used to supply both electrical power and to conduct the measured and processed signals.

Conventional two-wire sensors have the properties of switched current sources. Therefore, they can be connected only in parallel. Consequently, four lines are required to interconnect two two-wire sensors that are located at different places. If n two-wire sensors located at different places are connected in parallel, two n cable strands and an additional 4n−2 plugs are required. A disadvantage of these two-wire sensors is that many lines are required when several sensors are connected in parallel.

Therefore, there is a need for a two wire sensor capable of being connected in series with another two wire sensor.

SUMMARY OF THE INVENTION

Briefly, according to the present invention, an end stage is responsive to the two connections from a measuring sensor and provides a voltage signal indicative thereof, which, during operation of the measuring device is always greater than an adjustable reference voltage signal and whose amplitude is a measure of the physical quantity sensed by the measuring sensor.

The two-wire sensor of the present invention has the property of a voltage source, rather than a current source. Consequently, a plurality of the inventive two-wire sensors can be connected in series. A series connection with n two-wire sensors requires n+1 lines and 2n plugs, while a parallel connection requires 2n lines and 4n−2 plugs, which is twice as many components, if n>1.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
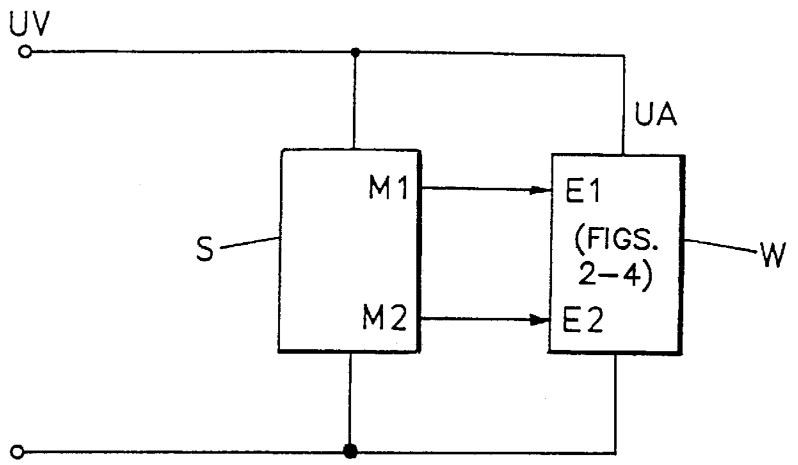
FIG. 1 is a block diagram illustration of a two-wire sensor device according to the present invention.

FIG. 1 is a block diagram illustration of an improved two-wire sensor device. The device comprises a measuring sensor (S) that provides measurement outputs M1 and M2, which are connected to the inputs E1 and E2 of a current-to-voltage converter (W). The converter (W) provides an output voltage signal (UA) indicative of the physical quantity sensed by the measuring sensor (S).

Figure 2:
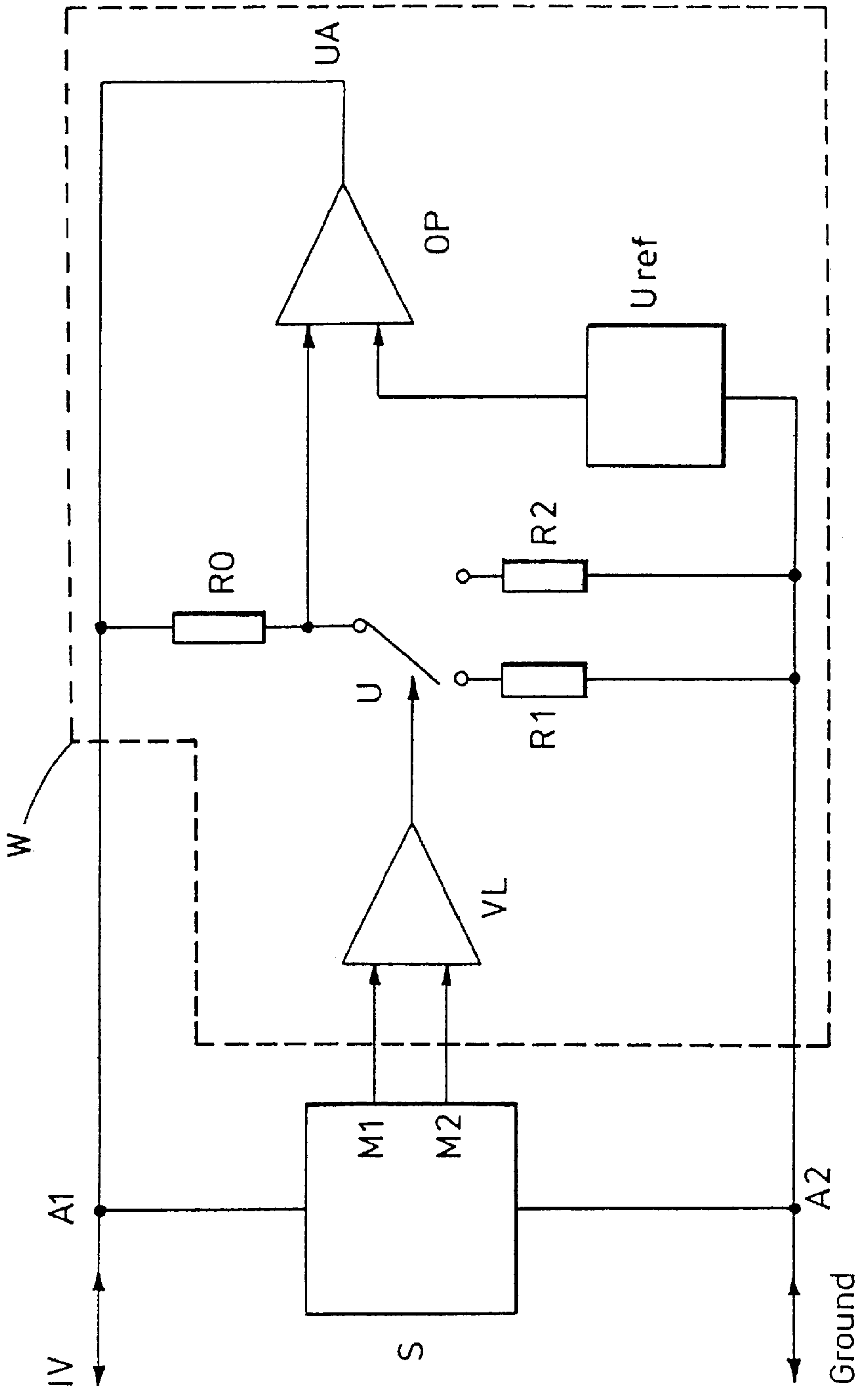
FIG. 2 is a schematic illustration of the two-wire sensor device.

FIG. 2 is a schematic illustration of one embodiment of the two wire sensor device. The device receives a supply current IV via connections A1, A2 for the power supply. The measuring sensor S provides the measurement output signals M1, M2 to a comparator VL, whose output is connected to the control input of a controllable changeover switch U. The input of the switch U is connected to one input of an operational amplifier OP and also, via a first resistor R0 to both the output of the operational amplifier OP and to one connection Al for the power supply. The two outputs of the switch U are connected, each via resistor R1, R2, respectively, to the other connection A2 of the power supply and to one connection of a reference voltage source Uref. The reference voltage source Uref is also connected to the other input of the operational amplifier OP.

The switch U is controlled by the output signal from the comparator VL. In a first state, the input of the switch U is applied via the resistor R1 to the connection A2 for the power supply. In a second state, the switch U is connected via the resistor R2 to the connection A2. Consequently, in the first switch state, the operational amplifier OP delivers a first voltage value at its output, while, in the second switch state it delivers a second voltage value. As a result, the voltage value UA is a measure of the physical quantity sensed by the measuring sensor S. In addition, the voltage value Ua is always larger than an adjustable reference voltage signal Uref. In one switching state, the voltage drop at the voltage divider formed by resistors R0 and R1 is compared in the operational amplifier OP with the reference voltage Uref. In the second switching state, the voltage drop at the voltage divider formed by resistors R0 and R2 is compared in the operational amplifier OP with the reference voltage Uref.

Figure 7:
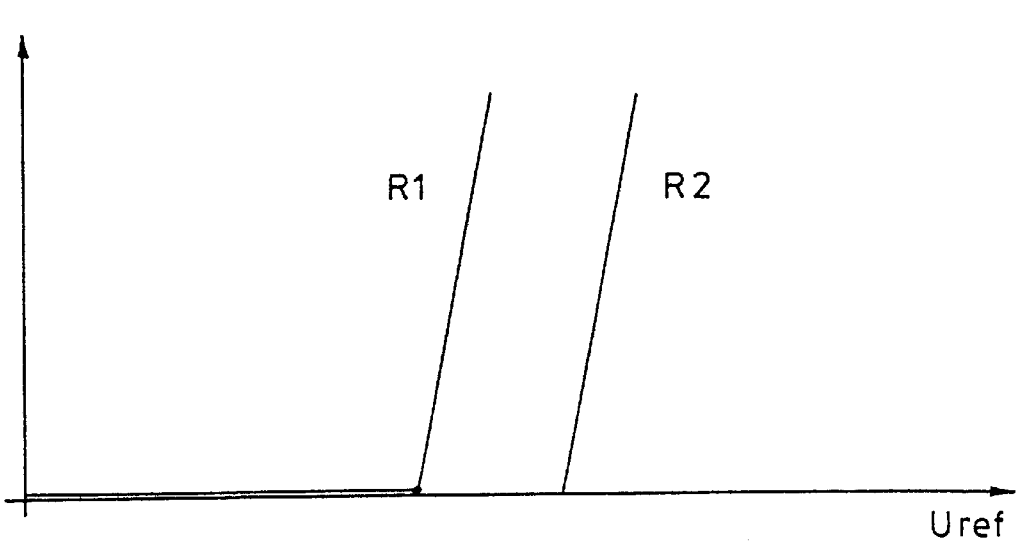
FIG. 7 illustrates a plot of a characteristic curve of the end stage of the two-wire sensor device illustrated in FIG. 2.

The characteristic curve illustrated in FIG. 7 applies to the second inventive embodiment, and corresponds to a Zener diode.

Applying the voltage UA present at the output of the operational amplifier OP to the power supply lines imparts to the inventive two-wire sensor the property of a voltage source. Significantly, this allows a plurality of two-wire sensors to be connected in series.

Figure 3:
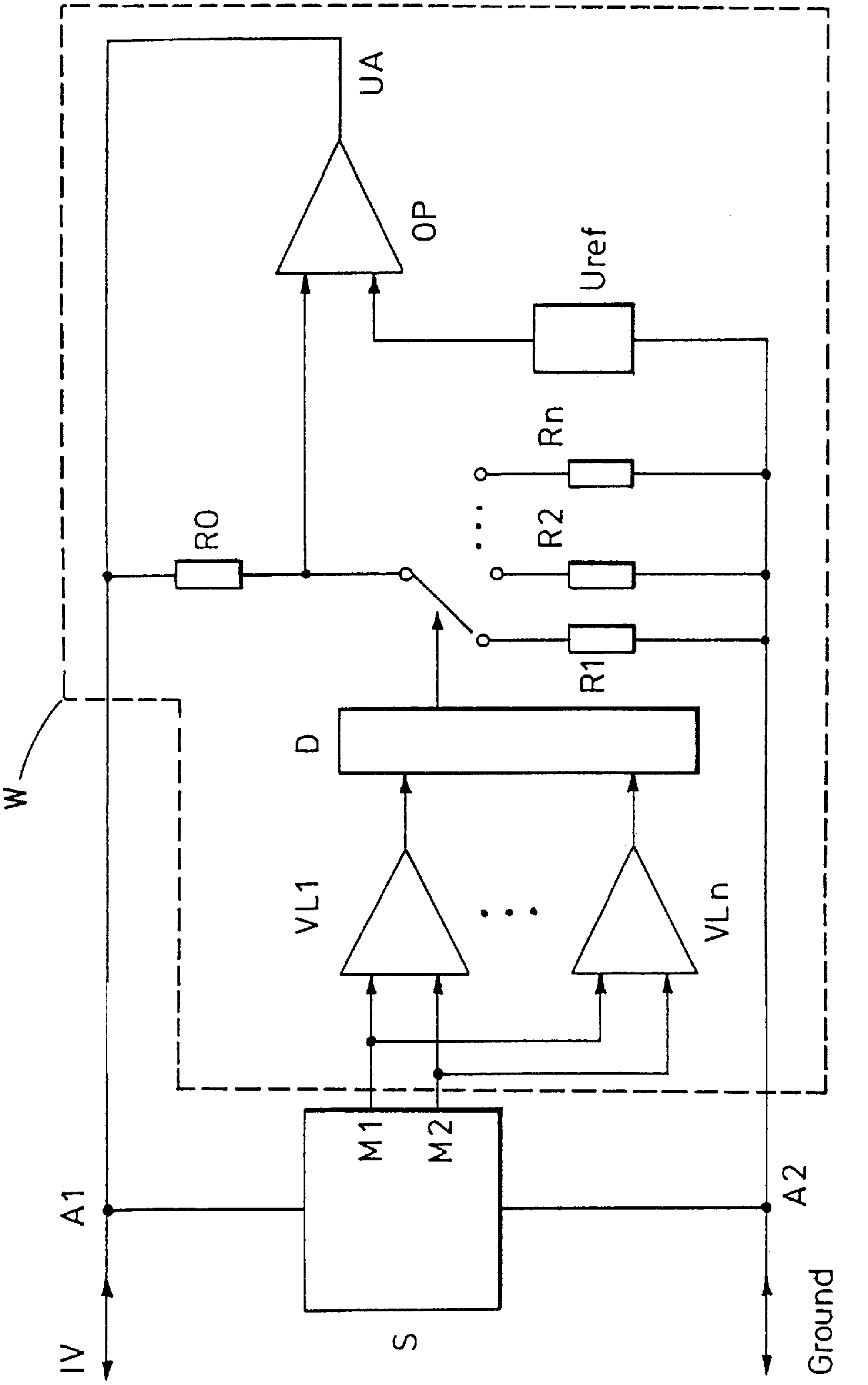
FIG. 3 is a schematic illustration of an alternative embodiment two-wire sensor device.

FIG. 3 illustrates an alternative embodiment two-wire sensor device. The embodiment illustrated in FIG. 3 differs from the embodiment illustrated in FIG. 2 in that it has n comparators VL1 to VLn whose outputs are connected to the inputs of a digital evaluation circuit D. The output of the digital evaluation circuit D is connected to the control input of the switch U. Each of the n outputs of this switch are connected, via an associated resistor R1 to Rn, to the connection A2 for the power supply and to the input of the reference voltage source Uref.

The comparator VL1, the comparator VL2, etc. up to, in some circumstances, the comparator VLn deliver a signal at their outputs as a function of the physical quantity measured by the measuring sensor S. Depending on the number of comparators delivering an output signal, the digital evaluation circuit D switches the controllable changeover switch U from the resistor R1 forward to finally the resistor Rn. Consequently, the operational amplifier OP delivers n different voltages UA at its output, which are a measure of the physical quantity sensed by the measuring sensor S and which always are greater than an adjustable reference voltage signal Uref.

Figure 4:
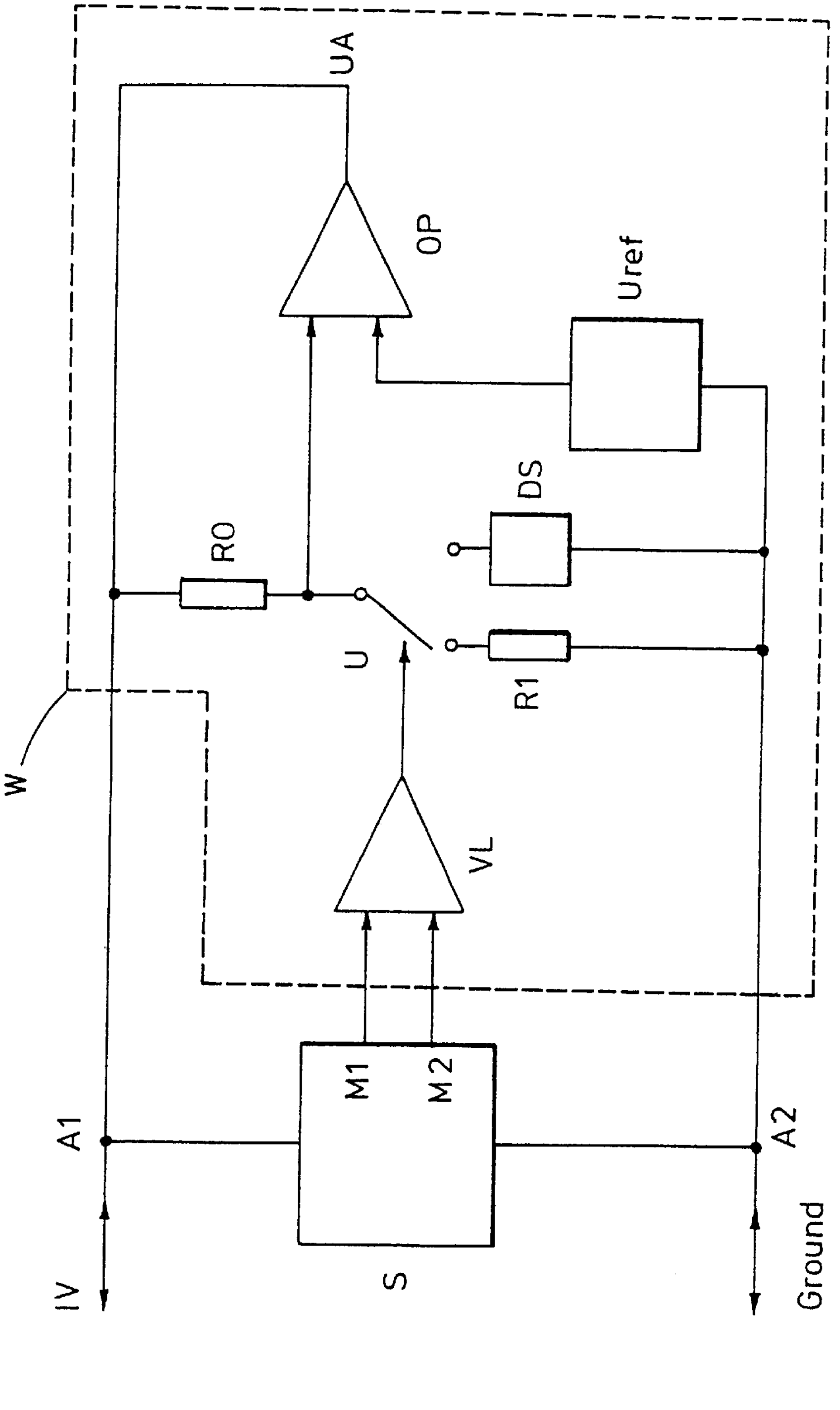
FIG. 4 is a schematic illustration of yet another alternative embodiment two-wire sensor device.

FIG. 4 illustrates yet another alternative embodiment two-wire sensor device. The embodiment illustrated in FIG. 4 differs from the embodiment illustrated in FIG. 2 in that the resistor R1 is replaced by a diode D or by a programmable digital circuit DS (e.g., a digital-analog converter). The digital circuit DS can be controlled, for example, by a data protocol that is transmitted by current modulation.

Figure 8:
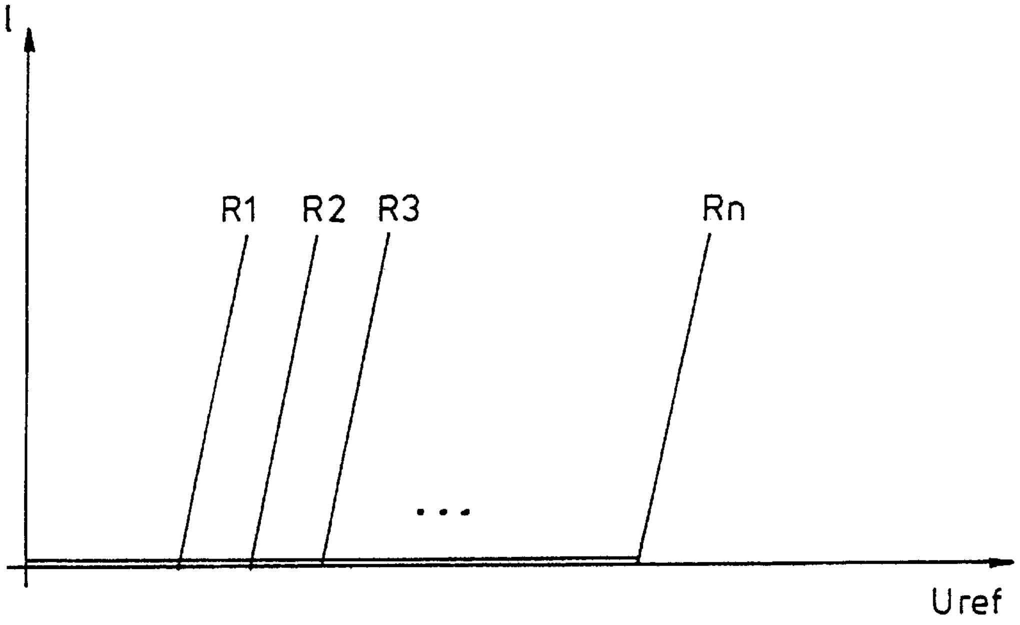
FIG. 8 illustrates a plot of a characteristic curve associated with the two-wire sensor device illustrated in FIG. 3.

FIG. 8 illustrates the characteristic curve of the end stage of the third embodiment. This characteristic curve corresponds to the characteristic of a Zener diode with a variable Zener voltage.

Figure 5:
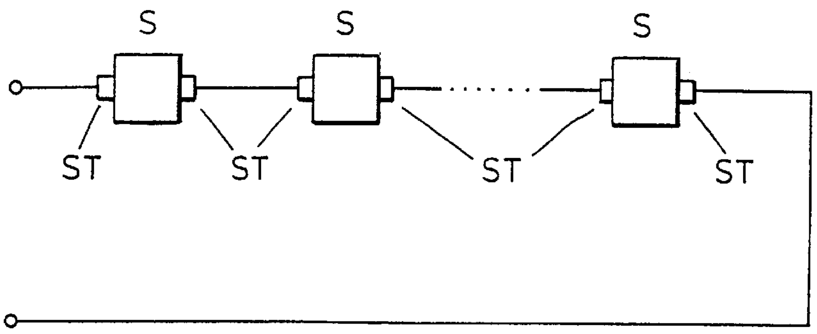
FIG. 5 illustrates a series connection of several inventive two-wire sensor devices.
Figure 6:
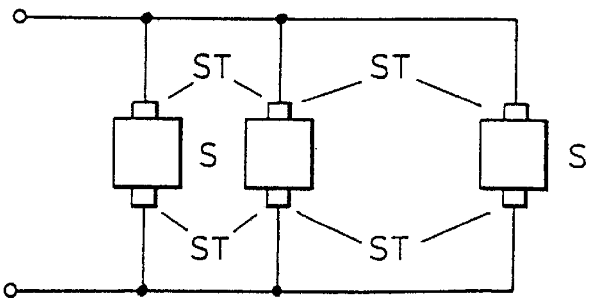
FIG. 6 illustrates a parallel connection of several inventive two-wire sensor devices.

FIG. 5 illustrates a plurality of two-wire sensors S connected in series. This requires n+1 lines and 2n plugs. In comparison, FIG. 6 illustrates n two-wire sensors connected in parallel. The parallel connection requires two 2n lines and 4n−2 plugs ST. The number of all connection components—lines and plugs—is 2n+4n−2=6n−2 components in the case of a parallel circuit, while it is n+1+2n=3n+1 components in the case of a series circuit. For large n, the parallel circuit consequently requires twice as many connection components as the series circuit.

The measuring sensor S may include for example a Hall sensor, a pressure sensor or a temperature sensor.

To achieve low power consumption, it is advantageous to reduce the idle current by short-time cycling.

It is especially advantageous to use Si technology for the reference voltage source Uref, because this technology achieves a reference voltage of high constancy without drift from component aging. Therefore, two-wire sensors with such reference voltage sources can be disposed at different locations with greatly differing temperatures, as is frequently the case for example in motor vehicle construction. For this reason, and because the inventive two-wire sensors can be connected in series, they are especially suited for installation in motor vehicles.

Although the present invention has been shown and described with respect to several preferred embodiments thereof, various changes, omissions and additions to the form and detail thereof, may be made therein, without departing from the spirit and scope of the invention.

What is claimed is:

1. A two-wire sensor device that includes a first connection and a second connection, comprising:

a measuring sensor that receives power via said first and second connections, and provides a measurement current signal indicative of a physical quantity sensed by said measurement sensors; and an end stage that receives and converts said measurement current signal to a measurement voltage signal that is applied across said first and second connections, which, during operation of said two-wire sensor device, is always greater than an adjustable reference voltage signal, wherein amplitude of said measurement voltage signal is indicative of the physical quantity sensed by said measuring sensor.

2. The two-wire sensor device of claim 1, wherein the end stage has a characteristic of the type of a Zener diode.

3. The two-wire sensor of claim 1, wherein the measurement outputs (M1, M2) of the measuring sensor (S) are connected to the inputs of a comparator (VL), whose output is connected to the control input of a controllable changeover switch (U), and that the input of the controllable changeover switch (U) is connected to one input of the operational amplifier (OP) and also, via a first resistor (R0), to both the output of the operational amplifier (OP) and to one connection (A1) for the power supply, and that the two outputs of the controllable changeover switch (U) are connected, each via a resistor (R1, R2), to the other connection (A2) to the power supply and to one connection of a reference voltage source (Uref), whose other connection is connected to the other input of the operational amplifier (OP).

4. The two-wire sensor of claim 3, wherein the measurement outputs (M1, M2) of the measuring sensor (S) are connected to the inputs of n comparators (VL1, VL2, . . . VLn), whose outputs are connected to the inputs of a digital evaluation circuit D, whose output is connected to the control input of the controllable changeover switch (U), and that the n outputs of the controllable changeover switch (U) are connected, each via a resistor (R1, R2, . . . Rn) to the other connection (A2) to the power supply.

5. The two-wire sensor of claim 1, wherein the measurement outputs (M1, M2) of the measuring sensor (S) are connected to the inputs of a comparator (VL), whose output is connected to the control input of a controllable changeover switch (U), and that the input of the controllable changeover switch (U) is connected to one input of the operational amplifier (OP) and also, via a first resistor (R0), both to the output of the operational amplifier (OP) and to one connection (A1) to the power supply, and that both one output of the controllable changeover switch (U), via a diode (DS) or a programmable digital circuit, and the other output of the controllable changeover switch (U), via a resistor (R1), are connected to the other connection (A2) to the power supply and to one connection of a reference voltage source (Uref), whose other connection is connected to the other input of the operational amplifier (OP).

6. The two-wire sensor of claim 5, wherein the programmable digital circuit (DS) is a digital-analog converter.

7. The two-wire sensor of claim 5, wherein the digital circuit (DS) is controlled by means of a data protocol.

8. The two-wire sensor of claim 7, wherein the data protocol for the digital circuit (DS) is transmitted by current modulation.

9. The two-wire sensor of claim 1, wherein a Hall sensor is used as the measuring sensor (S).

10. The two-wire sensor of claim 1, wherein said measuring sensor (S) comprises a pressure sensing device.

11. The two-wire sensor of claim 1, wherein said measuring sensor (S) comprises a temperature sensor.

12. The two wire sensor device of claim 1, wherein said end stage comprises:

means for comparing said measurement current signal, and for providing a control signal indicative thereof;

a switching circuit that receives said control signal, and selectively provides said measurement voltage signal across said first and second connections in response to the state of the control signal.

13. The two wire sensor device of claim 12, wherein said means for comparing includes a comparator circuit.

* * * * *